US012334398B2

(12) United States Patent
Mukesh et al.

(10) Patent No.: US 12,334,398 B2
(45) Date of Patent: Jun. 17, 2025

(54) MULTILAYER DIELECTRIC STACK FOR DAMASCENE TOP-VIA INTEGRATION

(71) Applicant: International Business Machines Corporation, Armonk, NY (US)

(72) Inventors: Sagarika Mukesh, Albany, NY (US); Devika Sarkar Grant, Rensselaer, NY (US); Fee Li Lie, Albany, NY (US); Shravan Kumar Matham, Guilderland, NY (US); Hosadurga Shobha, Niskayuna, NY (US); Gauri Karve, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 499 days.

(21) Appl. No.: 17/445,698

(22) Filed: Aug. 23, 2021

(65) Prior Publication Data

US 2023/0055600 A1 Feb. 23, 2023

(51) Int. Cl.
*H01L 21/768* (2006.01)
*H01L 23/522* (2006.01)

(52) U.S. Cl.
CPC .. *H01L 21/76885* (2013.01); *H01L 21/76802* (2013.01); *H01L 23/5226* (2013.01)

(58) Field of Classification Search
CPC ...................... H01L 23/5226; H01L 21/76816
See application file for complete search history.

(56) References Cited

U.S. PATENT DOCUMENTS

| 5,278,103 | A | * | 1/1994 | Mallon | ............ H01L 21/31051 257/E21.243 |
| 6,037,664 | A | | 3/2000 | Zhao et al. | |
| 6,756,297 | B2 | | 6/2004 | Park | |
| 6,815,333 | B2 | | 11/2004 | Townsend, III et al. | |

(Continued)

FOREIGN PATENT DOCUMENTS

| CN | 102044525 A | 5/2011 |
| CN | 102074498 A | 5/2011 |

(Continued)

OTHER PUBLICATIONS

Anderson et al., "Top Vias With Selectively Retained Etch Stops," U.S. Appl. No. 16/750,040, filed Jan. 23, 2020.

(Continued)

*Primary Examiner* — Eliseo Ramos Feliciano
*Assistant Examiner* — Mikka Liu
(74) *Attorney, Agent, or Firm* — Yee & Associates, P.C.

(57) ABSTRACT

A back-end-of-line (BEOL) component includes a substrate and a first layer of dielectric material arranged on the substrate. The first layer of dielectric material includes openings. The BEOL component further includes a first layer of metal material arranged in the openings. The BEOL component further includes an etch stop layer arranged on top of the first layer of dielectric material. The BEOL component further includes a second layer of metal material in direct contact with the first layer of metal material. The second layer of metal material includes at least one projection extending above the etch stop layer. The BEOL com- (Continued)

ponent further includes a second layer of dielectric material arranged on top of the etch stop layer and surrounding the at least one projection.

20 Claims, 7 Drawing Sheets

(56) References Cited

U.S. PATENT DOCUMENTS

| | | | |
|---|---|---|---|
| 6,992,344 B2 | 1/2006 | Coolbaugh et al. | |
| 6,992,391 B2 | 1/2006 | Ott et al. | |
| 7,534,696 B2 | 5/2009 | Jahnes et al. | |
| 8,586,478 B2 | 11/2013 | Soda et al. | |
| 9,257,406 B2 | 2/2016 | Dutta | |
| 9,799,558 B2 | 10/2017 | Tien et al. | |
| 10,312,188 B1 * | 6/2019 | Srivastava | H01L 23/528 |
| 10,354,912 B2 | 7/2019 | Xu et al. | |
| 2002/0192937 A1 | 12/2002 | Ting et al. | |
| 2003/0089987 A1 | 5/2003 | Parikh | |
| 2003/0116804 A1 | 6/2003 | Visokay et al. | |
| 2007/0087551 A1 * | 4/2007 | Gambino | H01L 21/0217 438/770 |
| 2010/0033395 A1 * | 2/2010 | Ding | H01Q 19/30 343/834 |
| 2011/0108994 A1 | 5/2011 | Liang et al. | |
| 2016/0181399 A1 * | 6/2016 | Jun | H01L 21/823475 438/294 |
| 2017/0256488 A1 * | 9/2017 | Lee | H01L 23/53238 |
| 2018/0164698 A1 | 6/2018 | Yang et al. | |
| 2018/0308801 A1 * | 10/2018 | Shih | H01L 21/02115 |
| 2018/0374744 A1 * | 12/2018 | Wu | H01L 21/76832 |
| 2020/0035605 A1 * | 1/2020 | Tsai | H01L 21/76877 |
| 2022/0216095 A1 * | 7/2022 | Singh | H01L 27/1203 |

FOREIGN PATENT DOCUMENTS

| | | |
|---|---|---|
| CN | 105448814 A | 3/2016 |
| CN | 112309955 A | 2/2021 |
| WO | 0199184 A2 | 12/2001 |

OTHER PUBLICATIONS

Written Opinion of the International Searching Authority, International Application No. PCT/CN2022/112955, Nov. 17, 2022, 10 pgs.

* cited by examiner

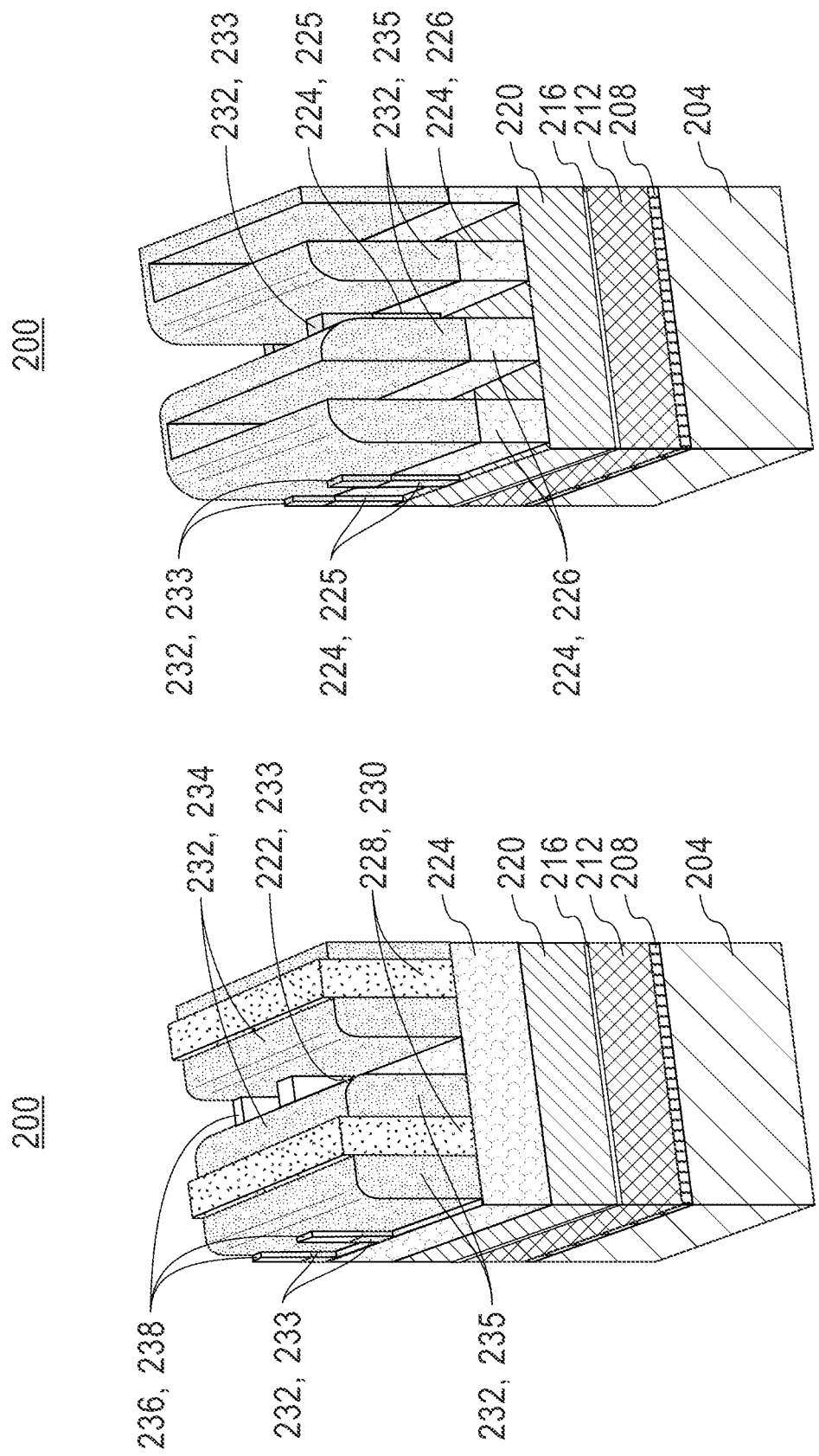

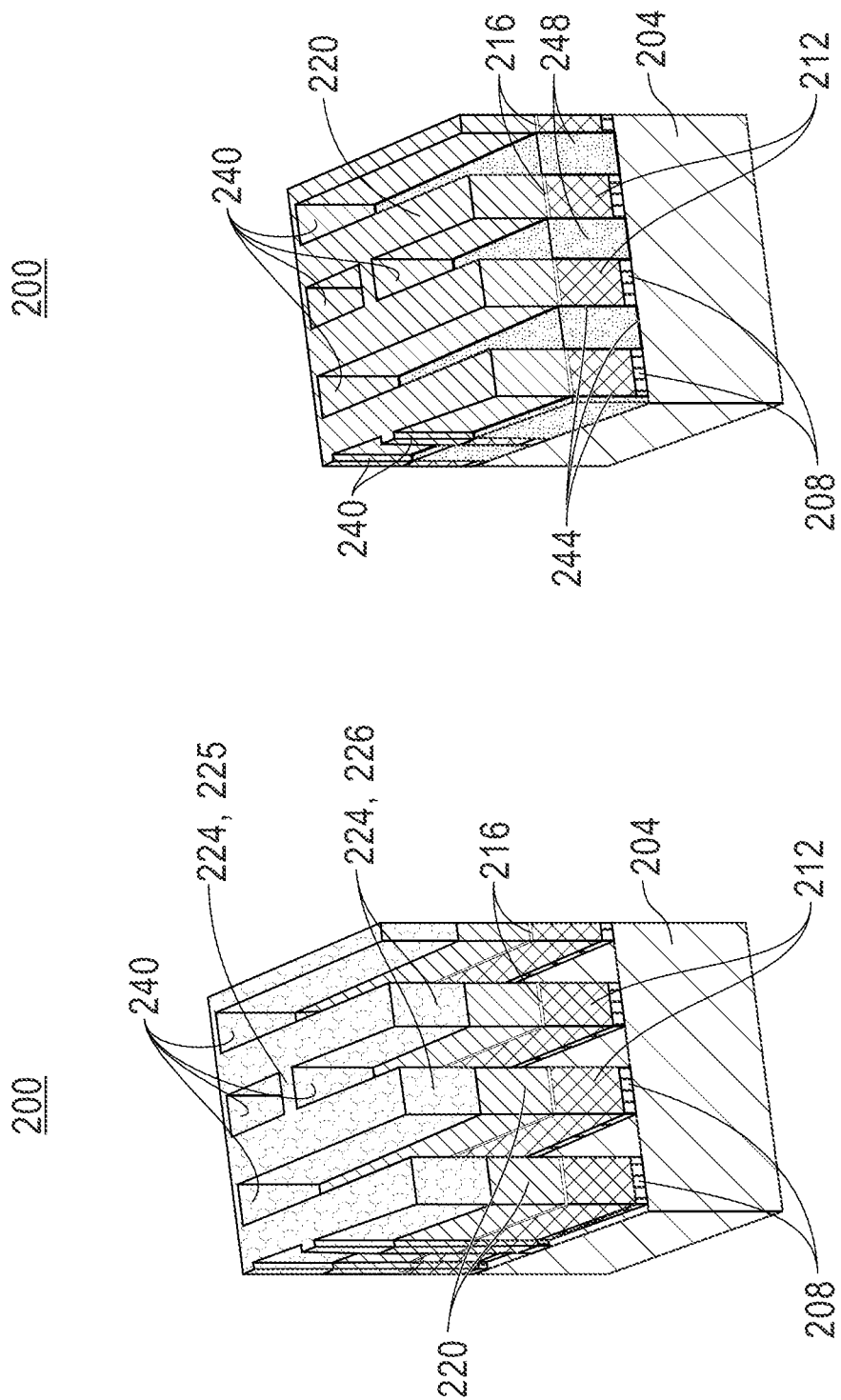

MULTILAYER DIELECTRIC STACK FOR DAMASCENE TOP-VIA INTEGRATION

BACKGROUND

The present disclosure relates to the electrical, electronic, and computer fields. In particular, the present disclosure relates to the interconnects of semiconductor devices and methods of making the interconnects of semiconductor devices.

SUMMARY

Embodiments of the present disclosure include a back-end-of-line (BEOL) component. The BEOL component includes a substrate and a first layer of dielectric material arranged on the substrate. The first layer of dielectric material includes openings. The BEOL component further includes a first layer of metal material arranged in the openings. The BEOL component further includes an etch stop layer arranged on top of the first layer of dielectric material. The BEOL component further includes a second layer of metal material in direct contact with the first layer of metal material. The second layer of metal material includes at least one projection extending above the etch stop layer. The BEOL component further includes a second layer of dielectric material arranged on top of the etch stop layer and surrounding the at least one projection.

Additional embodiments of the present disclosure include a method for forming a BEOL component. The method includes forming a first dielectric layer on a substrate, forming an etch stop layer on the first dielectric layer, and forming a second dielectric layer on the etch stop layer. The method further includes forming at least one opening through the second dielectric layer, through the etch stop layer, and through the first dielectric layer. The method further includes forming a first metal layer in the at least one opening. The method further includes forming a patterning layer on the first metal layer and on the second dielectric layer. The patterning layer includes at least one further opening. The method further includes forming a second metal layer in the at least one further opening.

Additional embodiments of the present disclosure include a computer program product comprising a computer readable storage medium having program instructions embodied therewith, the program instructions being executable by a computer system to cause the computer system to perform a method for forming a BEOL component. The method includes forming a first dielectric layer on a substrate, forming an etch stop layer on the first dielectric layer, and forming a second dielectric layer on the etch stop layer. The method further includes forming at least one opening through the second dielectric layer, through the etch stop layer, and through the first dielectric layer. The method further includes forming a first metal layer in the at least one opening. The method further includes forming a patterning layer on the first metal layer and on the second dielectric layer. The patterning layer includes at least one further opening. The method further includes forming a second metal layer in the at least one further opening.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 2E illustrates an example of a component following the performance of a portion of the example method of FIG. 1, in accordance with embodiments of the present disclosure.

FIG. 2F illustrates an example of a component following the performance of a portion of the example method of FIG. 1, in accordance with embodiments of the present disclosure.

FIG. 2G illustrates an example of a component following the performance of a portion of the example method of FIG. 1, in accordance with embodiments of the present disclosure.

FIG. 2H illustrates an example of a component following the performance of a portion of the example method of FIG. 1, in accordance with embodiments of the present disclosure.

DETAILED DESCRIPTION

Figure 1:
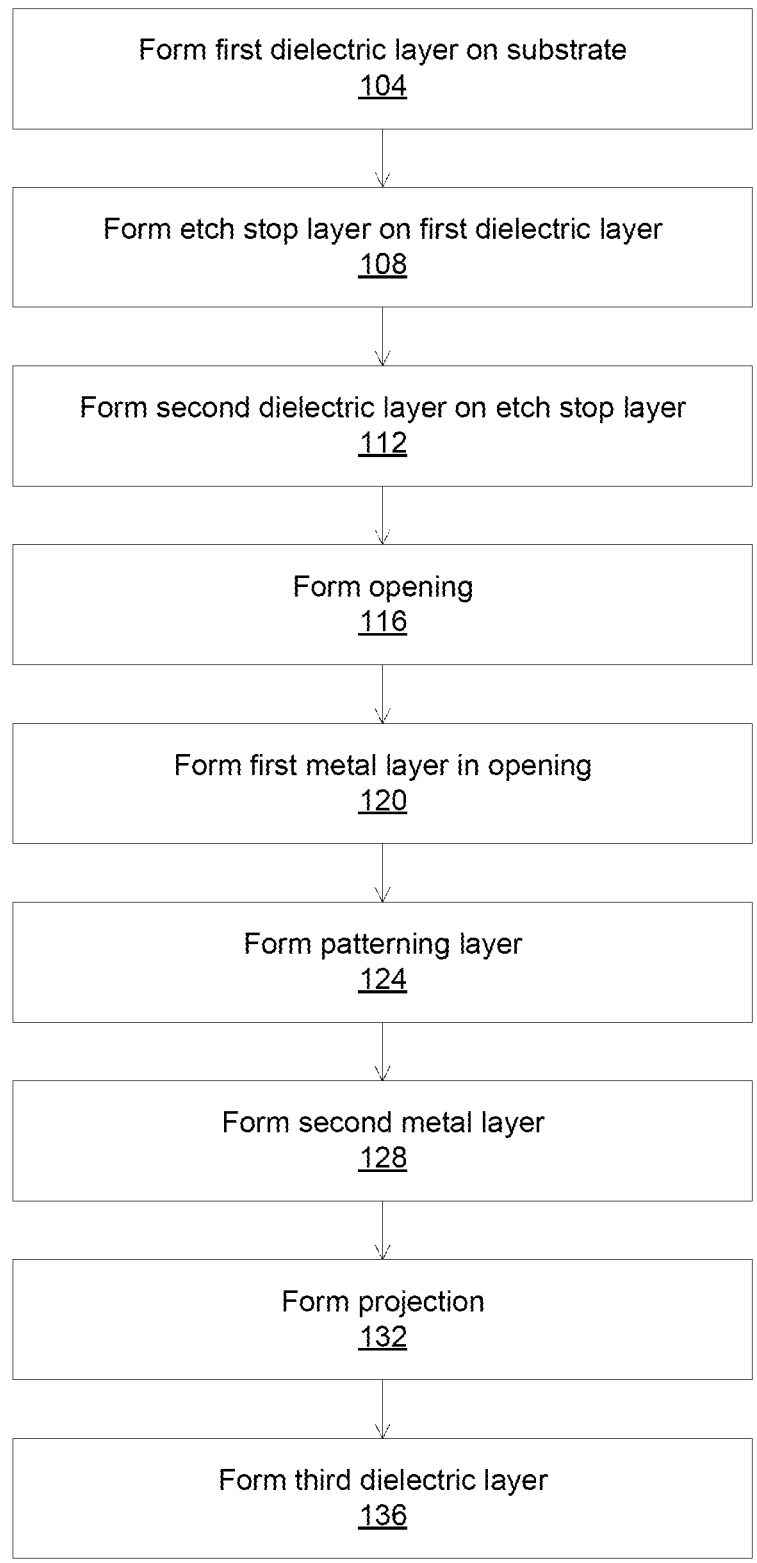
FIG. 1 illustrates a flowchart of an example method for forming a BEOL component, in accordance with embodiments of the present disclosure.

Aspects of the present disclosure relate generally to the electrical, electronic, and computer fields. In particular, the present disclosure relates to semiconductor devices. While the present disclosure is not necessarily limited to such applications, various aspects of the disclosure may be appreciated through a discussion of various examples using this context.

Various embodiments of the present disclosure are described herein with reference to the related drawings.

Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, in integrated circuits, interconnects are structures that connect two or more circuit elements (such as transistors or power rails) together electrically. In addition to providing the electrical connection to the front end devices (such as transistors), interconnects also go all the way back to the power delivery networks. Thus, interconnects, and their surrounding support components, are considered back-end-of-line (BEOL) components. Lines and vias are the most important components of interconnect technology. Lines provide electrical connection within a single layer, and vias provide electrical connection between layers in a physical electronic circuit.

In general, the various processes used to form lines and vias for a semiconductor chip or micro-chip that will be packaged into an IC fall into three general categories, namely, deposition, removal/etching, and patterning/lithography.

Deposition is any process that grows, coats, or otherwise transfers a material onto the substrate. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the substrate surface that would otherwise require higher temperatures associated with conventional CVD. Energetic ion bombardment during PECVD deposition can also improve the film's electrical and mechanical properties.

Removal/etching is any process that removes material from the substrate. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on substrates. With RIE the plasma is generated under low pressure (vacuum) by an electromagnetic field. High-energy ions from the RIE plasma attack the substrate surface and react with it to remove material.

Patterning/lithography is the formation of three-dimensional relief images or patterns on the semiconductor substrate for subsequent transfer of the pattern to a layer arranged beneath the pattern. In semiconductor lithography, the patterns are formed by a light sensitive polymer called a photoresist.

To build the complex structures that make up a transistor and the many wires that connect the millions of transistors of a circuit, lithography and etch pattern transfer steps are repeated multiple times. Each pattern being printed on the substrate is aligned to previously formed patterns, and gradually the conductive and insulative regions are built up to form the final device.

These processes can be used in different combinations and orders within the context of two main integration schemes for forming lines and vias. A subtractive scheme refers to processes of forming line and via structures by depositing metal, and then etching the metal to form lines and vias. Alternatively, a damascene scheme refers to the processes of forming line and via structures by depositing an oxide layer, forming a trench into the oxide layer, and then depositing metal into the trench. In particular, in a typical dual damascene process (also referred to as a dual damascene flow), a structure undergoes a diffusion barrier etch step, then a via dielectric is deposited. A subsequent etch step then forms a gap in which metal is deposited to form the lines and vias simultaneously.

Fabrication processes such as those discussed above may impose practical limitations on the resulting structures. For example, the minimum size of a structure may be limited by the fineness or selectivity of the procedures able to be performed.

One of the geometric properties of an interconnect structure is the pitch, which refers to the distance between the center of the width of one interconnect structure and the center of the width of an adjacent interconnect structure on the same level. Accordingly, the pitch is determined by the width and spacing of the interconnects, and the pitch, width, and spacing of the interconnects are ultimately constrained by design rules which ensure that the interconnect can be fabricated with a reasonable yield. For example, the width may be constrained by a minimum to prevent interconnect breakage and by a maximum to ensure that interconnects can be planarized by CMP. The spacing may be constrained by a minimum to ensure that interconnects can be fabricated without unintended conductive material bridging.

As technology continues to be scaled, and transistors are becoming smaller, increasingly tightly spaced interconnects are required to connect to them. Scaling interconnects pushes the boundaries of minimum widths, minimum spacings, and minimum pitches. However, these decreasing sizes and increasing densities introduce performance and reliability issues. Accordingly, the geometric properties of interconnect structures are limited not only by fabrication constraints, but also by performance constraints.

One particular issue that arises when the interconnect pitch is scaled to below 30 nanometers is that trench/via structures formed with a dual damascene flow have RIE induced damage of the via and trench dielectrics which increases the capacitance to an extent that can no longer be compensated for by adjusting the via/trench sizing.

More specifically, in a dual damascene flow, holes (which subsequently will be filled with metal) are formed in the dielectric with RIE. When forming the holes with RIE, within the holes there is a lining of dielectric, and the dielectric is easily damaged, for example, by oxidation. The dielectrics are typically made of SiCOH, and if they get damaged (oxidized), then they will have a greater amount of hydroxyls in them. This means, after RIE, which is a dry etch process, if a wet chemistry process is subsequently applied to clear any residues, the dielectric will etch too readily. As a result, if a hole diameter is intended to be drilled to 5 nanometers, because the dielectric is damaged by the RIE, applying a wet process after drilling the hole will cause the hole diameter to be greater than the intended 5 nanometers.

Accordingly, this damage to the dielectric causes the capacitance of the interconnect to increase because the damaged dielectrics become very lossy. Once a dielectric is damaged beyond a certain point, the capacitance value increases. As a result, after a certain point, efforts to scale the interconnects do not achieve any relative benefit because the capacitance increases due to damage even as the density is getting higher.

One way to address this dielectric damage is to form pillars and, between the pillars, a dielectric. In such procedures, the pillar formations result from either subtractive etching or complete removal of a sacrificial dielectric after RIE trench formation and metallization. Thus, such procedures do not require RIE etching after forming the pillars. Such methods introduce problems of their own, however, because the free-standing metal lines that are now being patterned on top of these layers are tall and flimsy, leaving them prone to collapse and breakage during subsequent fabrication processes. It is desirable to address the issue of parasitic capacitance and capacitance deterioration without introducing the issue of free-standing metal collapse and breakage.

Embodiments of the present disclosure may overcome these and other drawbacks of existing solutions by adding a dielectric layer that will provide mechanical anchoring and improved stability to the metal structures during fabrication. As discussed in further detail below, such embodiments include forming a first portion of metal that is surrounded, and therefore physically anchored, by a first dielectric layer and a second portion of metal that is free-standing above the first dielectric layer rather than having the entire metal structure free-standing on the substrate. As discussed in further detail below, in accordance with at least some embodiments, top metal structures are formed in a dielectric film, which is then removed using wet chemistries, and the resulting openings are subsequently filled with a lower dielectric constant material to help with capacitance reduction. Such embodiments reduce fabrication defects, facilitating improved reliability and performance, thereby saving resources including time and money.

FIG. 1 depicts a flowchart of an example method 100 for forming a BEOL component, according to embodiments of the present disclosure. The method 100 begins with operation 104, wherein a first dielectric layer is formed on a substrate. More specifically, the first dielectric layer, which may also be referred to as a trench dielectric layer, is deposited on top of a dielectric cap bi-layer, which is arranged on a substrate. Accordingly, the first dielectric layer is formed to cover the dielectric cap bi-layer, and the dielectric cap bi-layer covers the substrate.

In accordance with at least one embodiment, the substrate may be, for example, a silicon substrate. The dielectric cap bi-layer is formed of two sub-layers and provides electrical isolation for layers and structures on opposite sides of the dielectric cap bi-layer. The first dielectric layer may be made of a first dielectric material that is relatively mechanically robust. In accordance with at least one embodiment, the first dielectric material may be, for example, silicon carbon nitride.

At operation 108 of the method 100, an etch stop layer is formed on the first dielectric layer. In accordance with at least some embodiments, the etch stop layer is formed directly on, or in direct contact with, the first dielectric layer. In accordance with at least some embodiments, the etch stop layer is thin relative to the first dielectric layer. For example, the etch stop layer may be approximately 1 nanometer thick. In accordance with at least some embodiments, the etch stop layer may be formed by depositing or growing a film of etch stop material. The etch stop material may be, for example, aluminum nitride or aluminum oxynitride.

At operation 112 of the method 100, a second dielectric layer is formed on the etch stop layer. In accordance with at least some embodiments, the second dielectric layer is formed directly on, or in direct contact with, the etch stop layer. The second dielectric layer may also be referred to as a sacrificial dielectric layer. In accordance with at least some embodiments, the second dielectric layer is thick relative to the etch stop layer. In accordance with at least some embodiments, the second dielectric layer may be formed of a second dielectric material that is different than the first dielectric material. The second dielectric material may be, for example, silicon nitride.

Figure 2B:
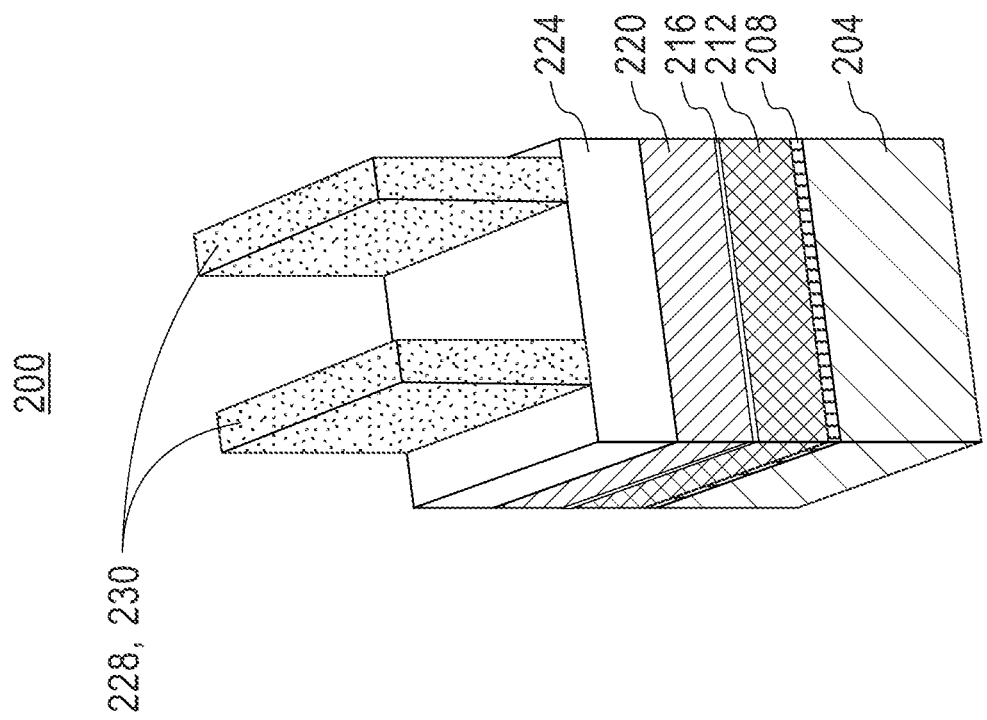
FIG. 2B illustrates an example of a component following the performance of a portion of the example method of FIG. 1, in accordance with embodiments of the present disclosure.
Figure 2A:
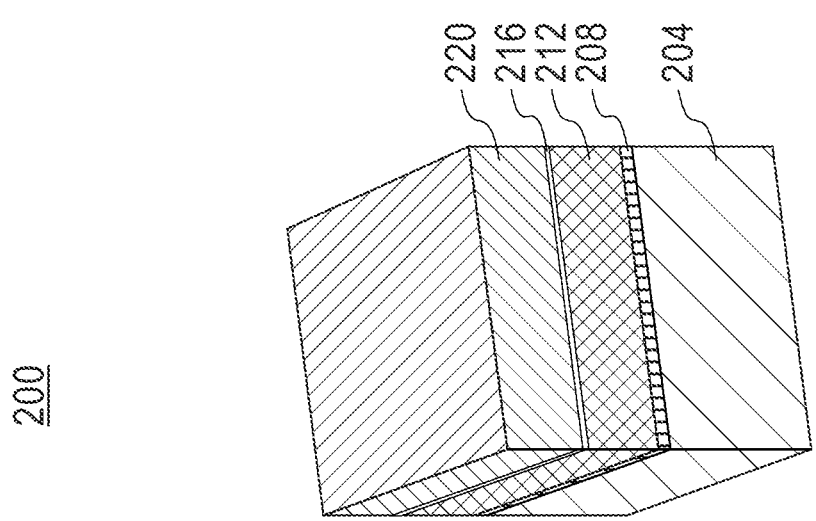
FIG. 2A illustrates an example of a component following the performance of a portion of the example method of FIG. 1, in accordance with embodiments of the present disclosure.

FIG. 2A depicts an example structure 200 following the performance of operations 104, 108, and 112 of the method 100. As shown in FIG. 2A, the structure 200 includes a substrate 204 and a dielectric cap bi-layer 208 covering the substrate 204. The structure 200 further includes a first dielectric layer 212 formed of a first dielectric material in direct contact with the dielectric cap bi-layer 208, an etch stop layer 216 formed of an etch stop material in direct contact with the first dielectric layer 212, and a second dielectric layer 220 formed of a second dielectric material in direct contact with the etch stop layer 216. The resulting stack of materials provides a trench dielectric layer (provided by the first dielectric layer 212), the etch stop layer, and a sacrificial dielectric layer (provided by the second dielectric layer 220), which enables the specific processes and resulting structures described in further detail below.

Returning to the method 100 of FIG. 1, at operation 116, at least one opening is formed through the second dielectric layer, through the etch stop layer, and through the first dielectric layer. In other words, at operation 116, materials of the stacked layers of the BEOL component are selectively removed to form one or more openings that expose specific portions of the underlying substrate. These openings will be subsequently filled with metal material to form interconnect structures. More specifically, the performance of operation 116 includes the performance of multiple sub-operations, example results of which are illustrated in FIGS. 2B-2G.

The non-limiting example embodiment illustrated in FIGS. 2B-2G demonstrates the results of the performance of several iterations of the deposition, removal, and patterning processes described above. The specific details of the sub-operations depend on the desired resulting interconnect structures and patterns that are being formed.

FIG. 2B depicts the example structure 200 following the deposition of a first hardmask material 224 and the deposition, patterning, and removal of a second hardmask material 228. The first hardmask material 224 forms what may be referred to as a memorization layer. The first hardmask material 224 may be, for example, titanium nitride or another material demonstrating similar relevant material properties. The second hardmask material 228 forms what may be referred to as mandrels 230, which provide underlying structure for further deposition, patterning, and removal processes.

Figure 2C:
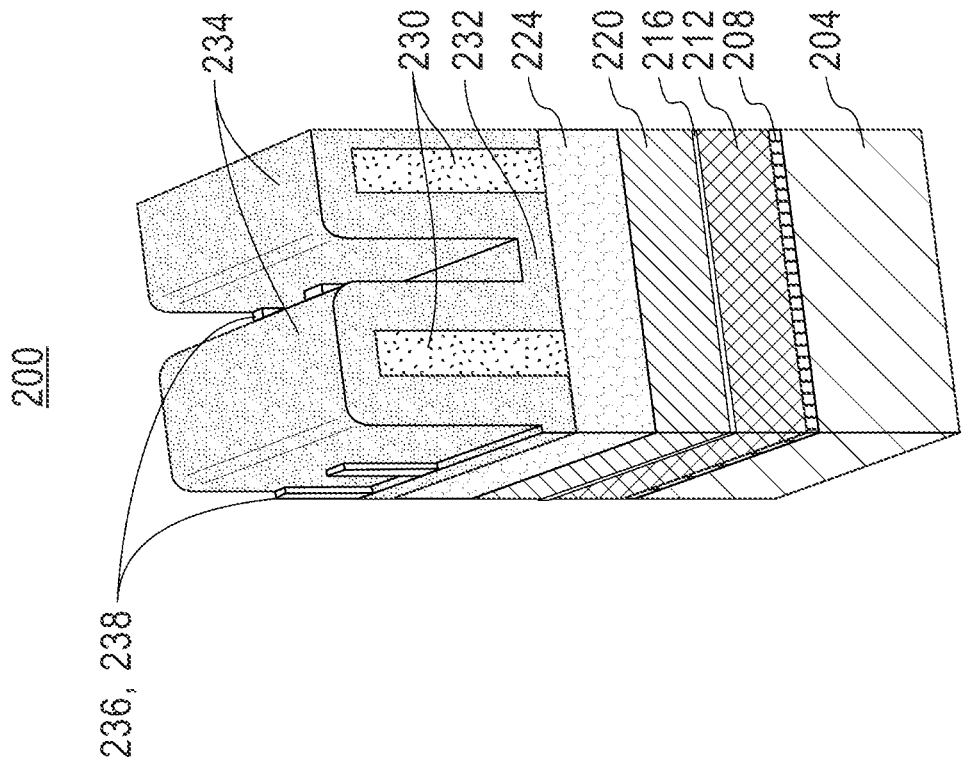
FIG. 2C illustrates an example of a component following the performance of a portion of the example method of FIG. 1, in accordance with embodiments of the present disclosure.

FIG. 2C depicts the example structure 200 following deposition of a spacer material 232. Where the spacer material 232 is applied over the mandrels 230, the topography provided by the mandrels 230 forms pillars 234 of the spacer material 232.

Figure 2D:
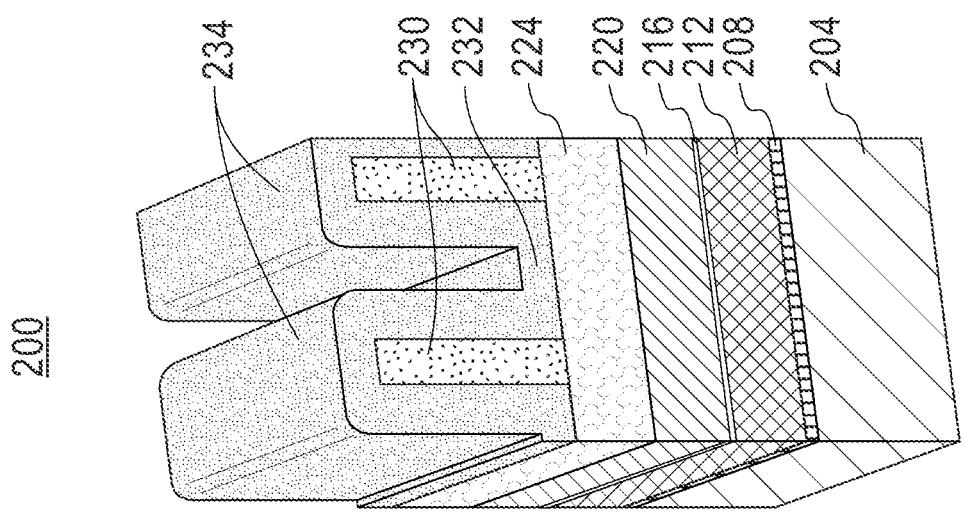
FIG. 2D illustrates an example of a component following the performance of a portion of the example method of FIG. 1, in accordance with embodiments of the present disclosure.

FIG. 2D depicts the example structure 200 following the deposition, patterning, and partial removal of a cut material 236. As shown, the cut material 236 forms ribs 238 that are arranged orthogonally relative to the pillars 234 of spacer material 232.

FIG. 2E depicts the example structure 200 following the selective removal (also referred to as "etch-back") of the spacer material 232 down to the first hardmask material 224 such that the first hardmask material 224 is exposed in the areas between the pillars 234 of spacer material 232. Because the cut material 236 is not removed when the spacer material 232 is removed down to the first hardmask material 224, the spacer material 232 remains in columns 233 beneath the cut material 236. Additionally, because the spacer material 232 formed pillars 234 over the mandrels 230 of second hardmask material 228, removing enough of the spacer material 232 to expose the first hardmask material 224 between the pillars 234 leaves remaining spacer material 232 surrounding the mandrels 230 that is sufficient to form walls 235 of spacer material 232 on either side of each of the mandrels 230.

FIG. 2F depicts the example structure 200 following the removal of the second hardmask material 228 and the cut material 236 (shown in FIG. 2E) and following subsequent removal of the resulting exposed first hardmask material 224. Accordingly, the first hardmask material 224 remains in columns 225 beneath the columns 233 of remaining spacer material 232 and in walls 226 beneath the walls 235 of remaining spacer material 232.

FIG. 2G depicts the example structure 200 following the removal of the spacer material 232 (shown in FIG. 2F), and the selective removal of the second dielectric layer 220, the etch stop layer 216, the first dielectric layer 212, and the dielectric cap bi-layer 208 to expose the substrate 204 except where the columns 225 and walls 226 of first hardmask material 224 remain. Therefore, following the performance of operation 116 materials of the layers 220, 216, 212, and 208 of the structure 200 of the BEOL component have been selectively removed to form openings 240 that expose specific portions of the underlying substrate 204. The specific arrangement and configuration of the openings 240 is selectable based on the desired pattern of conductive material to form lines of the interconnects structures of the BEOL component by depositing masking materials and etching certain negative patterns in the layers of materials.

Returning to the method 100 of FIG. 1, at operation 120 a first metal layer of metal material is formed in the at least one opening. The first metal layer is a portion of the conductive material of the interconnect structures that will form lines of the BEOL component. In accordance with at least one embodiment of the present disclosure, operation 120 further includes a number of sub-operations.

In particular, in accordance with at least one embodiment, the performance of operation 120 further includes removing the hardmask material that was used to pattern the openings. In accordance with at least one embodiment, the performance of operation 120 further includes depositing a liner material in the openings. The deposited liner material lines, but does not fill, the openings. In other words, the openings remain after the liner material has been deposited, and the openings are lined with the liner material. Accordingly, the deposited liner material is in direct contact with the portions of the substrate that have been exposed by the performance of operation 116. In accordance with at least one embodiment, the deposited liner material also covers exposed vertical portions of the first dielectric material and the etch stop material within the openings. Additionally, the liner material may extend to a height relative to the top of the substrate that is slightly above the height of the etch stop layer such that the liner material and the etch stop layer can fully cover the first dielectric layer and fully prevent subsequently deposited materials from contacting the first dielectric layer.

In accordance with at least one embodiment, the performance of operation 120 further includes depositing a metal material in the lined openings. More specifically, the metal material is deposited such that it is in direct contact with the liner material and fills the lined openings. In accordance with at least one embodiment, the performance of operation 120 further includes recessing the metal material to a target height to allow for via confinement. In accordance with at least one embodiment, the metal material can be recessed to a height that is approximately equal to or slightly lower than the height of the liner material. In accordance with at least one embodiment, the metal material can be recessed to a height that is substantially similar to the height of the etch stop layer relative to the top of the substrate.

FIG. 2H depicts the example structure 200 following the performance of operation 120 of the method 100. As shown, the first hardmask material 224 (shown in FIG. 2G) has been removed, a liner material 244 has been deposited in the openings 240, and a first metal layer 248 has been deposited in the lined openings 240 such that the first metal layer 248 is separated from the first dielectric layer 212 and the etch stop layer 216 by the liner material 244. The first metal layer 248 is also separated from the substrate 204 by the liner material 244 which promotes adhesion to the dielectric material and acts as a diffusion barrier.

Additionally, the first metal layer 248 has been recessed to a target height to allow for via confinement. Accordingly, as shown, the first metal layer 248 has been recessed to a height relative to the substrate 204 that is approximately equal to or slightly lower than the top of the liner material 244 and is substantially similar to the height at which the etch stop layer 216 is arranged relative to the substrate 204.

Returning to the method 100 of FIG. 1, at operation 124 a patterning layer is formed on the first metal layer and on the second dielectric layer. The patterning layer includes at least one further opening through the second dielectric layer that selectively exposes portions of the first metal layer. The at least one further opening will be subsequently filled with metal material to form vias of the interconnect structures of the BEOL component. Because the at least one further opening exposes the first metal layer, the metal material that forms the vias is electrically connected to the metal material that forms the lines of the interconnect structures of the BEOL component.

In accordance with at least one embodiment of the present disclosure, operation 124 further includes a number of sub-operations. In particular, in accordance with at least one embodiment, the performance of operation 124 further includes depositing a via template material that forms the patterning layer. In accordance with at least one embodiment, the via template material can be deposited by a spin on glass procedure. The via template material fills the remaining portions of the openings that were not filled by the metal material in the performance of operation 120. In other words, because the performance of operation 120 includes recessing the metal material, the metal material does not fill the openings to a height that extends to the second dielectric material. Accordingly, upon deposition of the via template material, the via template material is in direct contact with the deposited metal material and with the second dielectric material. The via template material covers the top exposed surface of the first metal layer and the top exposed surface of the second dielectric material. The via template material also covers exposed vertical portions of the second dielectric material within the openings.

In accordance with at least one embodiment, the performance of operation 124 further includes patterning the via template material and selectively removing portions of the via template material to form the patterning layer that includes the at least one further opening. Selectively removing portions of the via template material includes removing the via template material down to the first metal layer in the at least one further opening. Accordingly, in the at least one further opening, the metal material is exposed. Additionally, vertical portions of the second dielectric layer and the patterning layer are exposed in the at least one further opening.

In accordance with at least one embodiment, the performance of operation 124 further includes depositing a liner material within the at least one further opening. The deposited liner material is in direct contact with the portions of the first metal layer that have been exposed by the selective removal of the patterned portions of the via template material. In accordance with at least one embodiment, the deposited liner material also covers the exposed vertical portions of the second dielectric material and via template material within the at least one further opening. Additionally, the deposited liner material may extend to a height relative to the top of the substrate that is approximately equal to the top of the patterning layer.

In accordance with at least one embodiment, the performance of operation 124 further includes removing a layer of the liner material that covers the top surfaces of the first metal layer and the patterning layer such that the liner material only remains covering the vertical surfaces inside the at least one further opening.

Figure 2I:
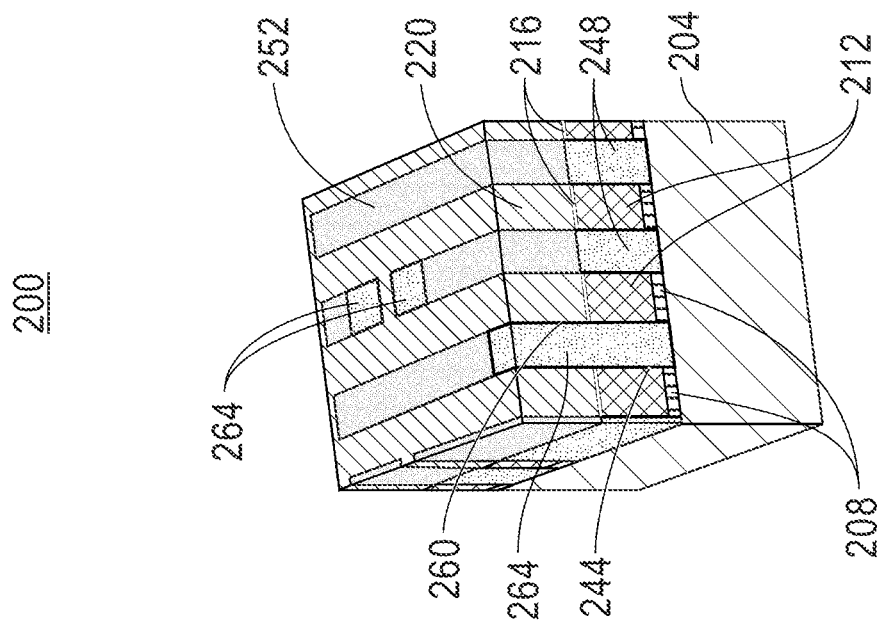
FIG. 2I illustrates an example of a component following the performance of a portion of the example method of FIG. 1, in accordance with embodiments of the present disclosure.

FIG. 2I depicts the example structure 200 following the performance of operation 124 of the method 100. As shown, the via template material fills the remaining portions of the openings 240 (shown in FIG. 2H) that were not filled by the metal material of the first metal layer 248 in the performance of operation 120 (shown in FIG. 1). Accordingly, the via template material forms a patterning layer 252 that is in direct contact with and covers the top surface of the first metal layer 248, the top surface of the second dielectric layer 220, and the exposed portions of the vertical surfaces of the second dielectric layer 220.

The patterning layer 252 includes further openings 256 formed by selectively removing portions of the via template material to expose portions of the top surface of the first metal layer 248. These further openings 256 are lined with a liner material 260. In at least one embodiment, the liner material 260 can be the same material as the liner material 244. Like the liner material 244, the deposited liner material 260 lines, but does not fill, the further openings 256. In other words, the further openings 256 remain after the liner material 260 has been deposited, and the further openings 256 are then lined with the liner material 260. Additionally, a portion of the liner material 260 is removed to re-expose the portions of the top surface of the first metal layer 248 that was exposed by the formation of the patterning layer 252. Thus, in accordance with at least one embodiment, the deposited liner material 260 covers exposed vertical portions of the second dielectric layer 220 and the patterning layer 252 within the further openings 256.

Returning to the method 100 of FIG. 1, at operation 128 a second metal layer is formed in the at least one opening that was formed in the performance of operation 124. The second metal layer is a portion of the conductive material of the interconnect structures that will form vias of the BEOL component. In accordance with at least one embodiment, the metal material that forms the second metal layer is the same as the metal material that forms the first metal layer such that the first metal layer and the second metal layer form a continuous and integrally connected structure following the performance of operation 128.

In accordance with at least one embodiment, the performance of operation 128 includes depositing metal material within the at least one further opening. In particular, the metal material can be deposited to any desired height within the lined at least one further opening. In at least one embodiment, the metal material is deposited to be approximately as high as the top of the patterning layer relative to the top of the substrate.

In accordance with at least one embodiment, the performance of operation 128 further includes performing CMP to planarize the top of the metal material of the second metal layer. In accordance with at least one embodiment, the CMP is stopped at the top of the second dielectric layer. In other words, in such embodiments, the height of the second metal layer is reduced to a height that is approximately the same as the height of the second dielectric layer. In such embodiments, the CMP simultaneously reduces the height of the patterning layer to be approximately the same as the height of the second dielectric layer.

Figure 2J:
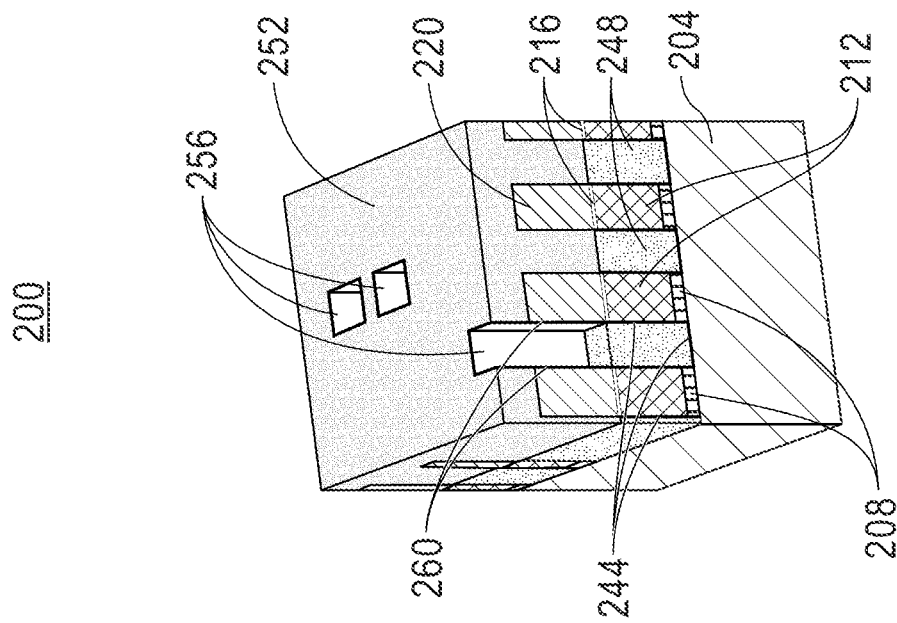
FIG. 2J illustrates an example of a component following the performance of a portion of the example method of FIG. 1, in accordance with embodiments of the present disclosure.

FIG. 2J depicts the example structure 200 following the performance of operation 128 of the method 100. As shown, deposited metal material forms a second metal layer 264 within the lined further openings 256 (shown in FIG. 2I).

Additionally, portions of metal material of the second metal layer 264, liner material 260, and via template material of the patterning layer 252 have been removed such that the top surface of the second metal layer 264, the top surface of the patterning layer 252, and the top surface of the second dielectric layer 220 are all substantially coplanar with one another. In other words, the top surfaces are all approximately the same height relative to the top of the substrate 204.

Returning to the method 100 of FIG. 1, at operation 132 the patterning layer and the second dielectric layer are removed such that the second metal layer forms at least one projection extending above the etch stop layer. More specifically, the patterning layer and second dielectric layer are removed down to the etch stop layer. In at least one example embodiment, the patterning layer and second dielectric layer can be selectively chemically removed by performing an etch with dihydrofolic acid (DHF) to remove the via template material of the patterning layer and the second dielectric material of the second dielectric layer while leaving the metal material of the first and second metal layers, the liner material, and the etch stop material of the etch stop layer.

Figure 2K:
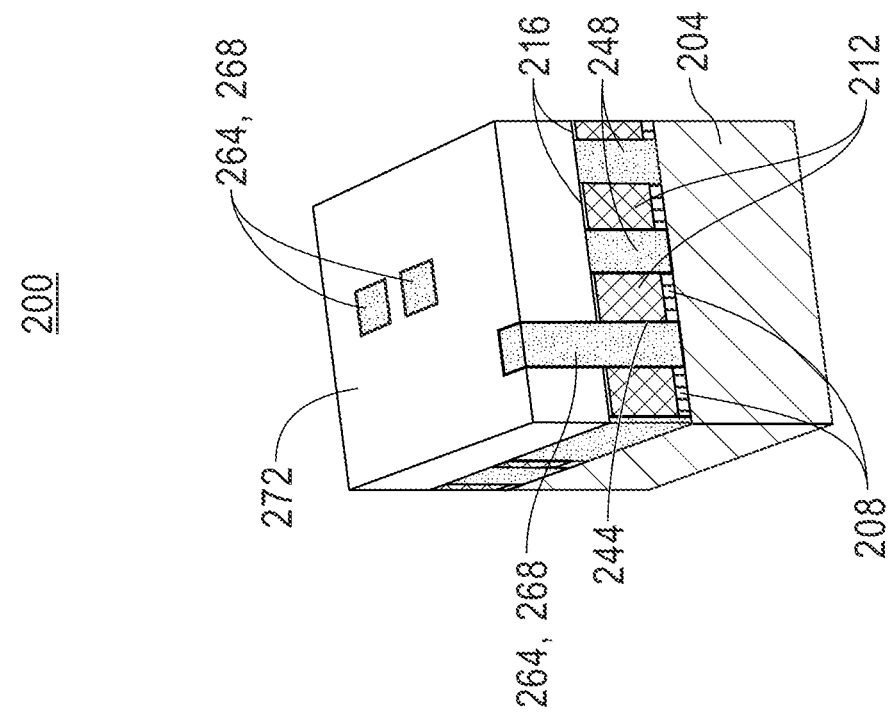
FIG. 2K illustrates an example of a component following the performance of a portion of the example method of FIG. 1, in accordance with embodiments of the present disclosure.

FIG. 2K depicts the example structure 200 following the performance of operation 132 of the method 100. As shown, the via template material of the patterning layer 252 (shown in FIG. 2J) and the second dielectric material of the second dielectric layer 220 (shown in FIG. 2J) have been selectively chemically removed down to the layer of the etch stop layer 216. The second metal layer 264, the liner material 260, the first metal layer 248, the liner material 244, and the etch stop layer 216 remain. Accordingly, the second metal layer 264 (together with the surrounding liner material 260) extends above the etch stop layer 216 to form projections 268. These projections 268 form the vias of the BEOL component.

As noted above, upon formation of the second metal layer 264, the first metal layer 248 and the second metal layer 264 become continuous and integrally combined with one another; the first metal layer 248 forming the lines, and the second metal layer 264 forming the vias of the BEOL component. The combined metal layers 248, 264 extend to a combined interconnect height relative to the top of the substrate 204. However, because only the vias (formed by the second metal layer 264) extend upwardly from the top of the lines (formed by the first metal layer 248) to the full combined interconnect height, the height of the lines relative to the top of the substrate 204 does not need to be exposed. In other words, the first metal layer 248 can remain embedded in, and mechanically anchored by, the surrounding first dielectric layer 212. This exposes less of the combined interconnect height to the risk of damage due to collapse and breakage during performance of the final operations in the preparation of the BEOL component. By exposing only the height of the second metal layer 264, the risk of damage to the interconnect structures is reduced.

Returning to the method 100 of FIG. 1, at operation 136 a third dielectric layer is formed on the etch stop layer such that the third dielectric layer surrounds the at least one projection. More specifically, the third dielectric layer covers the exposed top surfaces of the first metal layer and the exposed top surface of the etch stop layer. Accordingly, the third dielectric layer is arranged above the etch stop layer and the first dielectric layer is arranged beneath the etch stop layer. In other words, the etch stop layer separates the first dielectric layer and the third dielectric layer from one another. The third dielectric layer extends to a height that is approximately equal to the height of the second metal layer relative to the top of the substrate.

In at least one embodiment, forming the third dielectric layer can include backfilling with a third dielectric material to surround the at least one projection. As noted above, because the first metal layer is anchored by the first dielectric layer, backfilling with the third dielectric material is less likely to cause collapse and breakage of the interconnect structures. The third dielectric material can be, for example, a low-k dielectric material. Alternatively, the third dielectric material can be, for example, an ultra-low-k dielectric material. In at least one embodiment, forming the third dielectric layer can also include performing CMP to make the top surface of the third dielectric layer and the top surface of the second metal layer substantially coplanar with one another.

Notably, the third dielectric material, which surrounds the at least one projection that forms the via(s), can be a different material than the first dielectric material, which surrounds the first metal layer that forms the lines. More specifically, the third dielectric material can have a different k-value than the first dielectric material. The k-value of a dielectric material refers to the relative permittivity, or dielectric constant, of the material. This material property correlates to the mechanical strength, porosity, and capacitance of the dielectric. In particular, a higher k-value is correlated with a higher mechanical strength, a lower porosity, and a higher capacitance. Conversely, a lower k-value is correlated with a lower mechanical strength, a higher porosity, and a lower capacitance.

The desired material properties for a given dielectric material depend on the particular application. For example, while lower k-value materials provide a desirable capacitance advantage relative to higher k-value materials, their relatively high porosity makes them prone to electromigration, and their relatively low mechanical strength makes them susceptible to damage and defects that negatively impact reliability. These tradeoffs must be considered and balanced on a case-by-case basis.

Accordingly, the ability to use two different dielectric materials surrounding the interconnect structures is an advantage of the present disclosure. More specifically, the first dielectric layer, which surrounds the first metal layer that forms the lines of the interconnect structure, can have a higher k-value to provide robust mechanical strength and stability to the interconnect structures, reducing the chance of breakage and damage to the projections. In the same structure, the third dielectric layer, which surrounds the second metal layer that forms the vias of the interconnect structure, can have a lower k-value to provide a capacitance advantage. Because the higher k-value material is not used for the entire structure, the capacitance advantage is not sacrificed. Because the lower k-value material is not used for the entire structure, the mechanical strength is not sacrificed.

Additionally, the present disclosure advantageously facilitates tunability of the capacitance advantage of the structure. In particular, by controlling the height of the higher k-value material, and therefore the amount of the higher k-value material, the capacitance of the overall structure can be selectively tuned.

Unexpectedly, the present disclosure enables compensation for the trade-off between the capacitance penalty and the mechanical integrity. In one particular example, using a higher k-value material (k-value of 3.3), such as silicon carbon nitride, for the first dielectric layer to gain additional structural stability would be expected to result in a capacitance penalty of approximately 13 percent relative to a dielectric material having a k-value of 2.7. In other words, the theoretical penalty in capacitance for using the higher k-value material (3.3 vis-à-vis 2.7) would be approximately 13 percent. However, this theoretical penalty does not account for the reduction in this difference in capacitance due to the reduction in damage by replacing the more susceptible lower k-value material with the more robust higher k-value material.

More specifically, while the lower k-value material has a theoretical k-value of approximately 2.7, the actual k-value of this material in use is approximately 3.15 due to the RIE induced damage of approximately 1 nanometer difference in hole diameter. The present disclosure substantially compensates for the actual difference in capacitance because using a higher k-value material that is less susceptible to RIE induced damage reduces the capacitance penalty introduced by RIE induced damage.

Moreover, the height (and therefore the amount) of the higher k-value material can be modified, or tuned, by selecting the height of the first dielectric layer relative to the height of the third dielectric layer. Reducing the height of the first dielectric layer of the higher k-value material still provides improved structural stability to the interconnect structures and also reduces the capacitance penalty. In the particular example discussed above, by reducing the height of the first dielectric layer to be approximately 75 percent of the height of the first metal layer, the actual k-value of the overall structure is reduced to 2.925, which is nearly as low as the theoretical k-value of the lower k-value material (2.7).

Figure 2L:
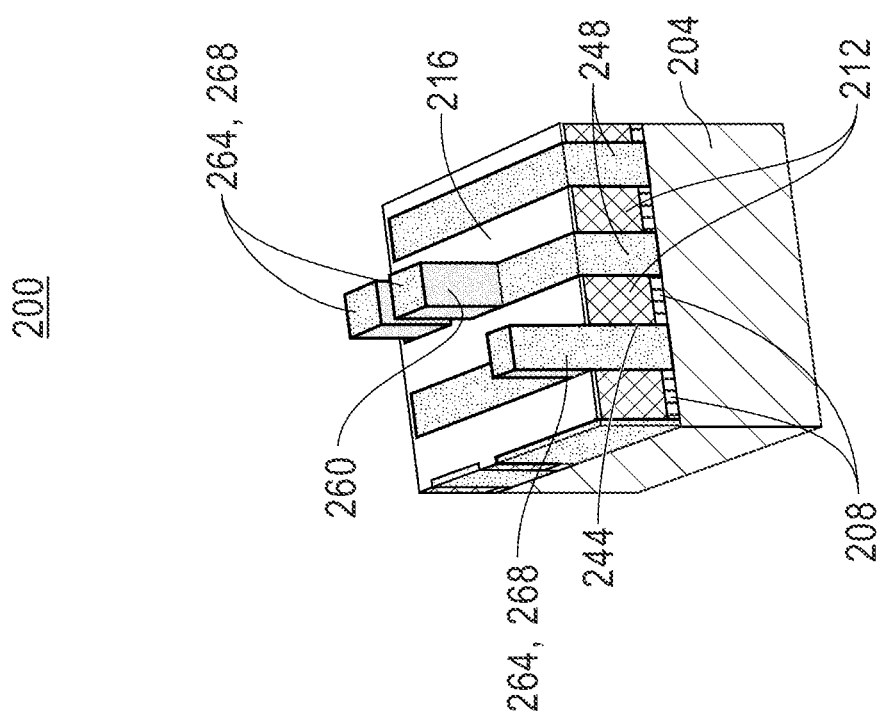
FIG. 2L illustrates an example of a component following the performance of a portion of the example method of FIG. 1, in accordance with embodiments of the present disclosure.

FIG. 2L depicts the example structure 200 following the performance of operation 136 of the method 100. As shown, a third dielectric layer 272 formed of a third dielectric material has been formed on top of the etch stop layer 216 and the first metal layer 248 and surrounding the projections 268. In accordance with at least one embodiment, the third dielectric material can be an ultra-low-k (ULK) dielectric material.

In the embodiment shown in FIG. 2L, the height of the first dielectric layer 212 is approximately equal to the height of the first metal layer 248. However, as discussed above, in alternative embodiments, the height of the first dielectric layer 212 can be less than the height of the first metal layer 248. In such embodiments, the etch stop layer 216 is arranged at a height that is also lower than the height of the first metal layer 248 relative to the substrate 204. In such embodiments, the third dielectric layer 272 extends down to the etch stop layer 216 and therefore covers a portion of the first metal layer 248 in addition to the second metal layer 264. Such embodiments utilize the advantageous capacitance tunability of the present disclosure discussed above.

Another unexpected advantage of the present disclosure is the improved structural integrity provided by the etch stop layer. In particular, semiconductor devices typically include a field region (not shown in the figures) that lacks the dense lines and vias of the interconnect structures. Due to the relative lack of structure, during fabrication, the flowable dielectric materials that are used to form dielectric layers tend to dip in field regions. In other words, the dielectric layer is thinner in the field region. Accordingly, during a subsequent removal procedure, when a portion of the dielectric layer is selectively removed from the areas containing the interconnect structures, portions of the dielectric layer could inadvertently be removed entirely in the field region, creating a problematic exposure of the wafer and/or lack of material between layers. By including the etch stop layer, the present disclosure prevents inadvertent total removal of a thinner dielectric layer in field regions, resulting in improved pattern uniformity and device reliability.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A back-end-of-line (BEOL) component, comprising:
   a substrate;
   a first layer of dielectric material arranged on the substrate, the first layer of dielectric material including trench openings, wherein the trench openings are lined with a liner material in direct contact with at least a portion of the substrate;
   a first layer of metal material forming interconnect lines arranged in the trench openings;
   an etch stop layer arranged on top of the first layer of dielectric material, wherein the first layer of metal material is separated from both the first layer of dielectric material and the etch stop layer by the liner material;
   a second layer of metal material in direct contact with the first layer of metal material, the second layer of metal material including at least one projection extending above the etch stop layer, the at least one projection having a shape with at least 2 sidewalls that are coplanar with respective elongated sidewalls of at least one of the interconnect lines of the first layer of metal;
   a second layer of dielectric material arranged on top of the etch stop layer, in direct contact with at least a portion of an upper surface of the first layer of metal material, and laterally surrounding the at least one projection; and
   a dielectric cap arranged in direct contact with the substrate and in direct contact with the first layer of dielectric material.

2. The BEOL component of claim 1, wherein the second layer of dielectric material is arranged on top of the first layer of metal material.

3. The BEOL component of claim 1, wherein the etch stop layer is in direct contact with the first layer of dielectric material.

4. The BEOL component of claim 1, wherein the etch stop layer is in direct contact with the second layer of dielectric material.

5. The BEOL component of claim 1, wherein the first layer of dielectric material is separated from the second layer of dielectric material by the etch stop layer.

6. The BEOL component of claim 1, wherein the dielectric material of the first layer of dielectric material is different than the dielectric material of the second layer of dielectric material.

7. The BEOL component of claim 6, wherein the dielectric material of the first layer of dielectric material has a higher dielectric constant than the dielectric material of the second layer of dielectric material.

8. The BEOL component of claim 1, wherein the first layer of dielectric material is separated from the substrate by the dielectric cap.

9. A back-end-of-line component, comprising:
   a substrate;
   a first layer of dielectric material arranged on the substrate, the first layer of dielectric material including trench openings, wherein the trench openings are lined with a liner material in direct contact with at least a portion of the substrate;
   a first layer of metal material forming interconnect lines arranged in the trench openings;
   an etch stop layer arranged on top of the first layer of dielectric material, wherein the first layer of metal material is separated from both the first layer of dielectric material and the etch stop layer by the liner material;
   a second layer of metal material in direct contact with the first layer of metal material, the second layer of metal material including at least one projection extending above the etch stop layer, the at least one projection having a shape with at least 2 sidewalls that are coplanar with respective elongated sidewalls of at least one of the interconnect lines of the first layer of metal;
   a second layer of dielectric material arranged on top of the etch stop layer, in direct contact with at least a portion of an upper surface of the first layer of metal material, and laterally surrounding the at least one projection; and
   a dielectric cap arranged in direct contact with the substrate and in direct contact with the first layer of dielectric material,
   wherein the first layer of dielectric material is separated from the substrate by the dielectric cap, and
   wherein the second layer of dielectric material is arranged on top of the first layer of metal material.

10. The back-end-of-line component of claim 9, wherein the etch stop layer is in direct contact with the first layer of dielectric material.

11. The back-end-of-line component of claim 9, wherein the etch stop layer is in direct contact with the second layer of dielectric material.

12. The back-end-of-line component of claim 9, wherein the first layer of dielectric material is separated from the second layer of dielectric material by the etch stop layer.

13. The back-end-of-line component of claim 9, wherein the dielectric material of the first layer of dielectric material is different than the dielectric material of the second layer of dielectric material.

14. The back-end-of-line component of claim 13, wherein the dielectric material of the first layer of dielectric material has a higher dielectric constant than the dielectric material of the second layer of dielectric material.

15. A back-end-of-line component, comprising:
a substrate;
a first layer of dielectric material arranged on the substrate, the first layer of dielectric material including trench openings, wherein the trench openings are lined with a liner material in direct contact with at least a portion of the substrate;
a first layer of metal material forming interconnect lines arranged in the trench openings;
an etch stop layer arranged on top of the first layer of dielectric material, wherein the first layer of metal material is separated from both the first layer of dielectric material and the etch stop layer by the liner material;
a second layer of metal material in direct contact with the first layer of metal material, the second layer of metal material including at least one projection extending above the etch stop layer, the at least one projection having a shape with at least 2 sidewalls that are coplanar with respective elongated sidewalls of at least one of the interconnect lines of the first layer of metal;
a second layer of dielectric material arranged on top of the etch stop layer, in direct contact with at least a portion of an upper surface of the first layer of metal material, and laterally surrounding the at least one projection; and
a dielectric cap arranged in direct contact with the substrate and in direct contact with the first layer of dielectric material,
wherein the first layer of dielectric material is separated from the substrate by the dielectric cap, and
wherein the dielectric material of the first layer of dielectric material is different than the dielectric material of the second layer of dielectric material.

16. The back-end-of-line component of claim 15, wherein the second layer of dielectric material is arranged on top of the first layer of metal material.

17. The back-end-of-line component of claim 15, wherein the etch stop layer is in direct contact with the first layer of dielectric material.

18. The back-end-of-line component of claim 15, wherein the etch stop layer is in direct contact with the second layer of dielectric material.

19. The back-end-of-line component of claim 15, wherein the first layer of dielectric material is separated from the second layer of dielectric material by the etch stop layer.

20. The back-end-of-line component of claim 15, wherein the dielectric material of the first layer of dielectric material has a higher dielectric constant than the dielectric material of the second layer of dielectric material.

\* \* \* \* \*